United States Patent [19]

Dittrich

[11] Patent Number: 5,616,970
[45] Date of Patent: Apr. 1, 1997

[54] METHOD AND CIRCUIT ARRANGEMENT FOR DRIVING SEMICONDUCTOR SWITCHES IN A SERIES CIRCUIT

[75] Inventor: Andreas Dittrich, Zürich, Switzerland

[73] Assignee: Asea Brown Boveri AG, Baden, Switzerland

[21] Appl. No.: 385,546

[22] Filed: Feb. 8, 1995

[30] Foreign Application Priority Data

Feb. 8, 1994 [DE] Germany ............................ 44 03 941.7

[51] Int. Cl.$^6$ .................................................. H01H 83/14
[52] U.S. Cl. ...................... 307/126; 307/112; 307/116; 307/125; 327/365; 327/419; 327/427; 327/432; 327/440; 327/434; 363/53
[58] Field of Search ................................... 307/126, 112, 307/125, 116; 363/53; 361/88; 327/432, 427, 419, 434, 440, 365

[56] References Cited

U.S. PATENT DOCUMENTS

| | | | |
|---|---|---|---|
| 4,356,416 | 10/1982 | Weischedel | 307/570 |
| 4,423,457 | 12/1983 | Brajder | 361/86 |
| 4,540,933 | 9/1985 | Teulino | 323/271 |
| 5,149,995 | 9/1992 | Hofgraff | 327/440 |
| 5,187,632 | 2/1993 | Blessing | 361/103 |

FOREIGN PATENT DOCUMENTS

2007451  5/1979  United Kingdom.

*Primary Examiner*—William M. Shoop, Jr.
*Assistant Examiner*—Albert W. Paladini
*Attorney, Agent, or Firm*—Oblon, Spivak, McClelland, Maier & Neustadt, P.C.

[57] ABSTRACT

In a method and a circuit arrangement for driving semiconductor switches in a series circuit, in which a voltage limiting device is assigned to each semiconductor switch, the power losses of the voltage limiting devices are detected by a control equipment for equalizing the voltage distribution across the semiconductor switches. The control equipment generates modified control pulses for each semiconductor switch from a common control pulse on the basis of the detected power losses of the voltage limiting devices. By this means, the power loss of the voltage limiting devices is controlled to a minimum.

6 Claims, 7 Drawing Sheets

METHOD AND CIRCUIT ARRANGEMENT FOR DRIVING SEMICONDUCTOR SWITCHES IN A SERIES CIRCUIT

BACKGROUND OF THE INVENTION

1. Field of the Invention

The invention relates to a method for driving semiconductor switches a series circuit and to a circuit arrangement for carrying out this method.

2. Discussion of the Background

It is generally known that semiconductor switches—such as power transistors, MOSFET transistors, IGBTs (insulated gate bipolar transistor) and GTOs (gate turn-off thyristor)—have a limited maximum reverse voltage. In the event that higher voltages are to be switched, it is necessary to connect the semiconductor switches in series. In this arrangement, the switched DC voltage exceeds the maximum permitted voltage of each of the semiconductor switches connected in series. In consequence, a protective device must ensure that the maximum permitted voltage on each semiconductor switch is not exceeded, irrespective of the operating condition. This is the case if the DC voltage is distributed uniformly across the individually opened semiconductor switches. A uniform or symmetrical voltage distribution over the switched-off semiconductor switches is normally achieved in steady operation by means of balancing resistors.

In dynamic operation, that is to say during a switch-on or switch-off process, the symmetrical voltage distribution across the semiconductor switches is only ensured if the switching behavior of the individual semiconductor switches is identical. Nevertheless, it is known that the switching behavior or the switch-on and switch-off delay, respectively, of the individual semiconductor switches is different. The dissimilar switch-on and switch-off times, moreover, vary with time and as a function of the temperature. This leads to an equally rapid switch-on or switch-off of the individual semiconductor switches not being guaranteed at all operating points. Thus, the more rapid semiconductor switch accepts a higher voltage during the switching off, because the slower semiconductor switch is still conducting. In consequence, the maximum reverse voltage $U_{cmax}$ of the most rapid semiconductor switch can be exceeded, so that it is destroyed. The same condition also occurs in the case of unsymmetrical switching on of the semiconductor switches. In this case, the slowest semiconductor switch accepts the full voltage, since all the remaining semiconductor switches are already switched on and accept a lower voltage.

The publication JP-A-55-033313 discloses a circuit arrangement for driving semiconductor switches connected in series, in which the balancing of the switching behavior is guaranteed by means of an individual displacement of the switching commands of the individual semiconductor switches. In this arrangement, the most rapid semiconductor switch receives its control pulse with a maximum delay and the slowest semiconductor switch receives the control pulse immediately, so that all the semiconductor switches finally switch simultaneously.

The technical solution described in publication EP-A-0202962 further proposes to determine the individual displacement of the switching commands of the individual semiconductor switches by means of a measuring technique, in that, for example, the actual transistor switching edges are measured and the necessary switching delay is determined therefrom. This solution is, however, not able to be applied in practice in the case of IGBTs because of the extremely short delay times which can be detected only inaccurately with a measuring technique.

In addition, it can be gathered from the teaching of publication EP-B1-0288422 to measure the steady voltages of the semiconductor switch and to control them to a prescribed desired value by displacing the switching edges. In this case, the procedure is that if the semiconductor voltage in the last switch-off was too large, the next switch-off edge is delayed by a controller. If the voltage of the preceding switch-off was too low, the switch-off edge is displaced to an earlier instant.

One problem of the last two solutions consists in the fact that the first switchings off are carried out uncompensated, because the individual delay time of the respective semiconductor switch must first be built up. The known switching arrangements and, respectively, the methods used in the latter for driving the semiconductor switches can consequently only be used under the condition that the first switchings off are carried out at a reduced DC voltage, so that the corresponding control device can align with the switching behavior, before the full operating voltage or the full operating current, respectively, is built up. Apart from this restriction, a further problem exists in connection with the protection of the semiconductor switches in the event of failure or disturbance of the control equipment for the voltage. In this respect, there is no usable solution to date.

Also known from the prior art is a method for the protection of serially connected semiconductor switches, a voltage limiting device being assigned to each semiconductor switch for carrying out the method. In the case of high voltages on the semiconductor switch, which exceed a specific value and thereby activate the voltage limiting device, a large current flows through the voltage limiting device at a high voltage. In so doing, pulse-like electrical losses occur in the voltage limiting device, which considerably reduce the lifetime of the voltage limiting device in the event of repeated switching processes.

SUMMARY OF THE INVENTION

Accordingly, one object of the invention is to provide a novel method and a circuit arrangement for driving semiconductor switches in a series circuit, by means of which the semiconductor switches are protected reliably and in the simplest manner in every operating condition.

In accordance with these features, the power losses of the voltage limiting devices assigned to the individual semiconductor switches are detected by means of a control equipment which generates modified control pulses for each semiconductor switch from a common control pulse, by means of these modified control pulses equalizes the voltage distribution across the semiconductor switches and thereby simultaneously controls the power loss of the voltage limiting devices to a minimum.

In the method according to the invention, the common control pulse is modified in such a manner that it is displaced by means of the control equipment until the respective voltage limiting device no longer responds. In consequence, the switching of the semiconductor switches becomes symmetrical and the semiconductor voltages remain below the response voltage of the corresponding voltage limiting devices. Since the response voltage of the individual voltage limiting devices are not continuously exceeded, the lifetime of their components increases. In this way, according to the invention, a combined protection of the series circuit is guaranteed, in that firstly the corresponding semiconductor switch is protected from overload by means of the passive voltage limiting device and, subsequently, the voltage limiting device itself is protected against overload by means of the load-relieving control. By this means, the functioning of the semiconductor switches connected in series is guaranteed in each operating condition. In the event of very rapid disturbances or in the event of failure of the control equipment, the protective function is taken over by the respective passive voltage limiting device. Slow changes of the switching behavior of the semiconductor switches or asymmetries are controlled out by means of the abovedescribed active control and the voltage limiting device is thereby relieved of load.

By means of the method according to the invention it is made possible to connect in series semiconductor switches such as IGBTs, GTOs or transistors having different switching times and without preselection. A further advantage of the invention consists in the fact that the circuit arrangement can be implemented by means of small and cost-effective components as voltage limiting devices having a small power loss, such as zener diodes or varistors. At the same time, the lifetime of the circuit arrangement increases, since the components of the voltage limiting device are relieved of load. The method according to the invention, moreover, makes possible the advantageous application of rapidly switching semiconductor switches—such as, for example, IGBTs—in the high voltage range.

For carrying out the method according to the invention, a circuit arrangement is preferably provided.

Advantageous refinements of the method according to the invention and of the circuit arrangement for driving semiconductor switches in a therefore series circuit are described.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
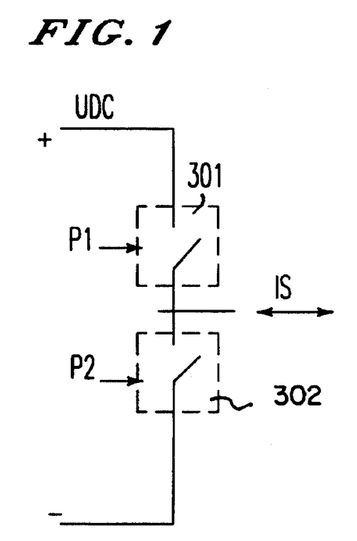
FIG. 1 shows a circuit arrangement of semiconductor switches of a conventional series circuit.
Figure 2:
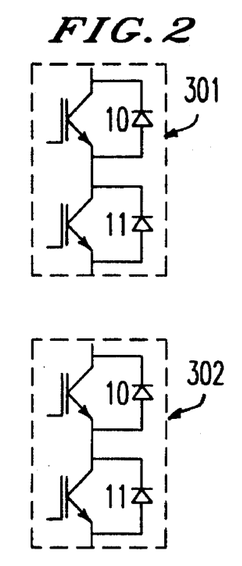
FIG. 2 shows a detailed representation of the switches from the circuit arrangement according to FIG. 1

Referring now to the drawings, wherein like reference numerals designate identical or corresponding parts throughout the several views, FIG. 1 shows a circuit arrangement of semiconductor switches of a conventional series circuit, namely a switch bridge, in which a DC voltage $U_{dc}$ is modulated by an upper switch 301 and a lower switch 302. As shown in FIG. 2 each switch comprises at least two serially connected semiconductor switches 10 and 11, which are implemented here as IGBTs with antiparallel diodes. Other non-latching semiconductor switches such as, for example, bipolar transistors, can also be used as semiconductor switches. The non-latching semiconductor switches used here are known for the fact that, after switching on, they can be switched off by means of a small control current.

Figure 3:
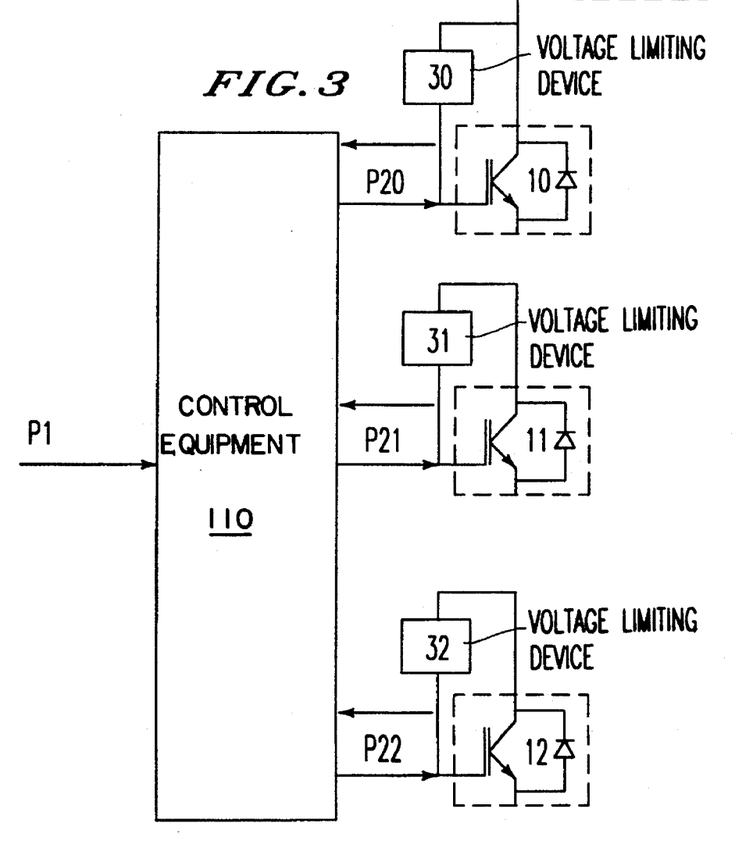
FIGS. 3–13 show exemplary embodiments of the circuit arrangement for carrying out the method according to the invention for driving semiconductor switches in a series circuit.

According to a first exemplary embodiment of the circuit arrangement in FIG. 3, the latter has three semiconductor switches 10, 11 and 12 connected in series, which belong to one of the abovementioned switches. One voltage limiting device 30, 31 and 32, respectively is provided in each case to each of the non-latching semiconductor switches 10, 11 and 12, the said voltage limiting device being connected between the collector and the control electrode of the semiconductor switch.

All the voltage limiting devices 30, 31 and 32, respectively, are connected, in a manner which allows measurement, to a control equipment 110. The said control equipment is connected for its part to an external control pulse generator, not shown in FIG. 3, in order to generate modified control pulses $P_{20}$, $P_{21}$ and $P_{22}$ for the individual semiconductor switches from a control pulse $P_1$ common to all the semiconductor switches. The circuit arrangement in FIG. 3 functions in the manner described in the following.

As an example, if the voltage acting on the semiconductor switch 10 exceeds a specific limiting value, a current flows through the corresponding voltage limiting device 30. The power loss thereby produced in the voltage limiting device 30 is detected or measured, respectively, by means of the control equipment 110, which modifies the common control pulse $P_1$ by delaying it, corresponding to this measured power loss, to form a modified control pulse $P_{20}$. This process also runs in the same manner with respect to the remaining semiconductor switches 11 and 12, so that as a result the voltage distribution across all the semiconductor switches 10, 11 and 12 is equalized. By means of this balancing of the voltage distribution across the semiconductor switches, the power loss itself of the voltage limiting devices 30, 31 and 32 is controlled to a minimum.

Figure 4:
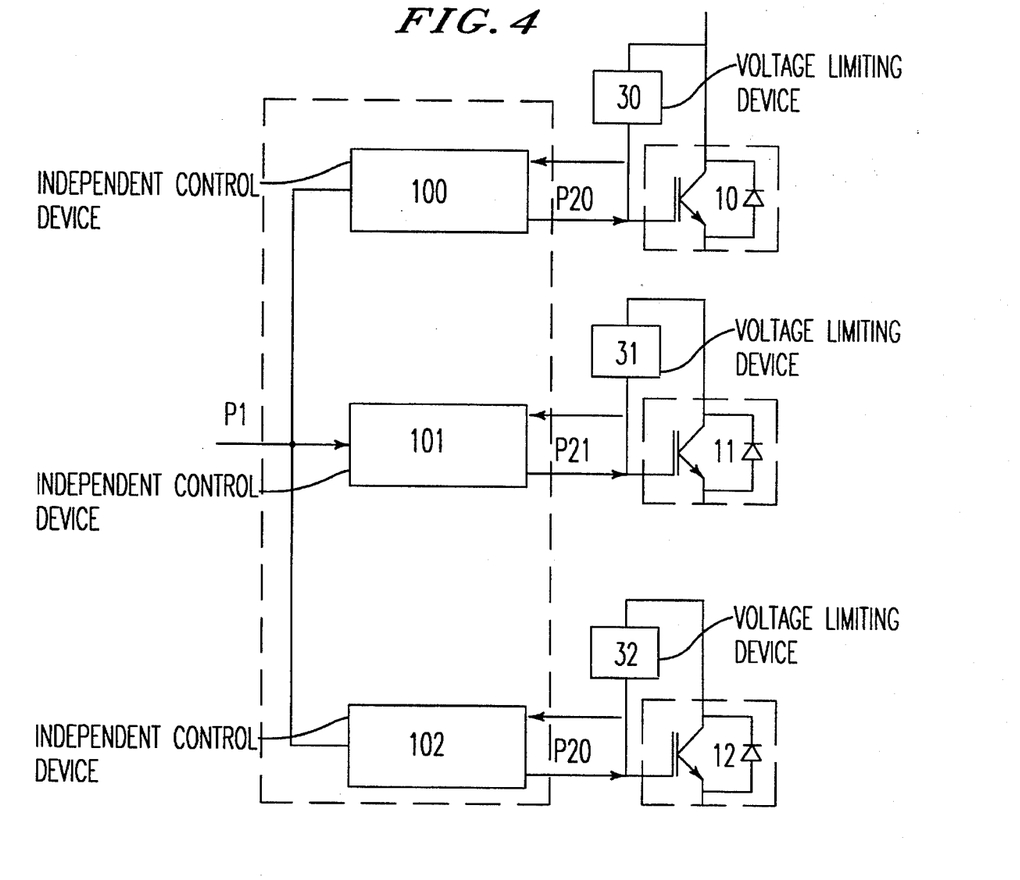

According to the second exemplary embodiment of the switch arrangement shown in FIG. 4, the control equipment 110 comprises three independent control devices 100, 101 and 102, which are assigned to the corresponding semiconductor switches 10, 11 and 12.

Figure 5:
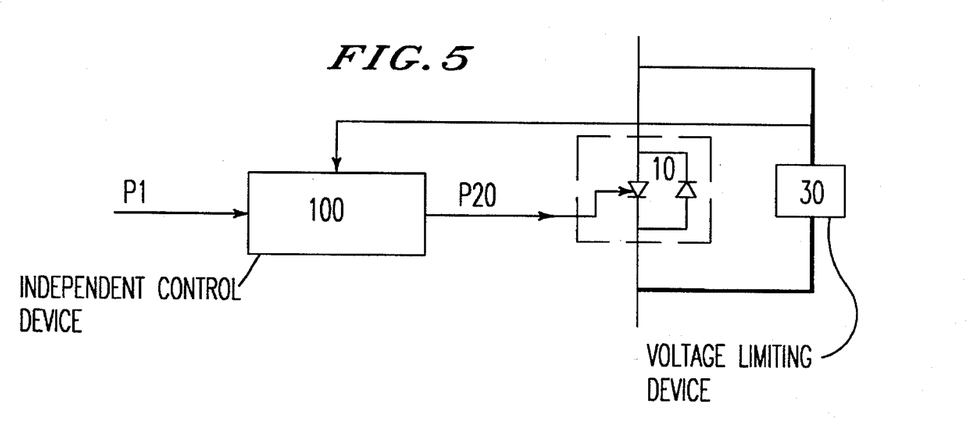

According to a third exemplary embodiment of the switch arrangement, shown in FIG. 5, each semiconductor switch is formed, using the example of the semiconductor switch 10, as a latching semiconductor switch—for example as a GTO or an MCT (MOS controlled thyristor). Latching semiconductor switches are known for the fact that, after switching on, they can be switched off by means of a large control current. Here, the corresponding voltage limiting device is connected, using the example of the voltage limiting device 30, between anode and cathode of the semiconductor switch 10.

Various variables can be used as a measure of the power loss of the voltage limiting devices 30, 31 and 32 to be detected by the control equipment 110 or by the individual control devices 100, 101 and 102, respectively. As an example of such a variable, the time integral of the current through the respective voltage limiting device can be detected. This time integral, multiplied by the voltage of the voltage limiting device, yields the loss energy and is thus proportional to the power loss of the voltage limiting device at a specific switching frequency. Since the response voltage of the voltage limiting device is constant, the current time integral is representative of the power loss.

The time integral of the current, representative of the power loss, is itself proportional to the amplitude of the current and to the duration of the current flow in the voltage limiting device. Accordingly, only the amplitude of the current $I_s$ through the semiconductor switches 10, 11 and 12 can be detected by the control equipment or control device, since the amplitude is thus proportional to the power loss of the voltage limiting device. A method of proceeding of this type is especially well suited for a binary evaluation of the power loss of the voltage limiting device. For the implementation of a binary amplitude measuring element in the control equipment or control device, only a comparator is needed, which generates a pulse (I-pulse) in the event of overshooting a specific amplitude value. A binary current flow duration measuring element generates a pulse of constant length (I-pulse), which indicates the presence of a current in the voltage limiting device.

However, only the duration of the current $I_s$ through the semiconductor switches 10, 11 and 12 can also be detected by the control equipment or control device, since the duration is also proportional to the power loss of the voltage limiting device. For the implementation of a current flow duration measuring element in the control equipment or control device, only a comparator is needed, which generates a pulse during the current flow through the voltage limiting device. The length of the pulse in this case is proportional to the resulting power loss.

The temperature of the elements of the voltage limiting device is also representative of the power loss of the latter. This temperature can be detected electronically and used as a basis for the control, the thermal time constant of these elements having, nevertheless, to be taken into account.

Irrespective of the type of the semiconductor switches used, in all exemplary embodiments of the circuit arrangement, a snubber can be connected in parallel with each semiconductor switch for limiting the voltage peaks when switching off the semiconductor switch current.

Figure 6:
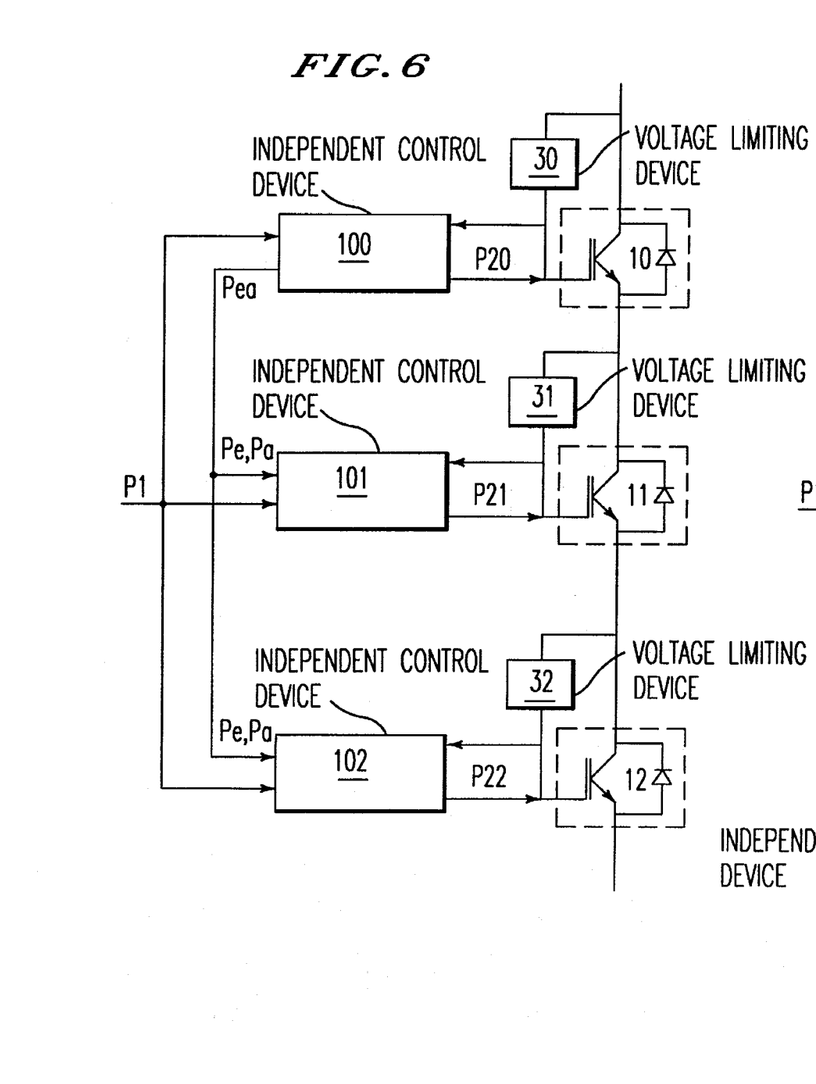

In the fourth exemplary embodiment of the circuit arrangement, shown in FIG. 6, the first control device 100 is coupled to the remaining control devices 101 and 102. The semiconductor switch 10, to which the first control device 100 belongs, is used as reference switch or master, the remaining semiconductor switches 31 and 32 having to be designated as slaves. By means of this circuit arrangement, the following manner of proceeding is guaranteed: the control device 100 of the master 10 displaces or delays the common control pulse $P_{20}$ by a constant initial time value, which is greater than the maximum asymmetry times of the semiconductor switch 10 and of the signal electronics. The same delay is loaded as initial value of the control pulses $P_{21}$ and $P_{22}$ of the slaves 11 and 12. The control device 100 does not alter the initial values of the pulse displacement of the master 10. The control devices 101 and 102 of the slaves 11 and 12 displace the control pulses $P_{21}$ and $P_{22}$ of the slaves 11 in such a way that the power losses of the voltage limiting devices 31 and 32 are controlled to a minimum or to zero, respectively. If the master 10 switches off too slowly, and the voltage limiting device 30 intervenes, the control device 100 generates the signal $P_a$, which specifies the power loss of the voltage limiting device 30 during switching off. The signal $P_a$ is fed to the remaining control devices 101 and 102 and, in the latter, leads to an equal increase of the pulse delay of the switch-off edges. In this way it is achieved that the switching off of the master 10 becomes more rapid, compared with the switching off of the slaves 11 and 12, without altering the delay of the modified control pulse $P_{20}$ on the master 10 in so doing. If the master 10 switches on too rapidly, and the voltage limiting device 30 intervenes, the control device 100 then generates the signal $P_e$, which specifies the power loss of the voltage limiting device 30 during switching on. The signal $P_e$ is fed to the remaining control devices 101 and 102 and, in the latter, leads to an equal reduction of the pulse delay of the switch-on edges. In this way it is achieved that the switching on of the master 10 becomes slower, compared with the switching on of the slaves 11 and 12, without altering the delay of the modified control pulse $P_{20}$ at the master 10 in so doing.

Figure 7:
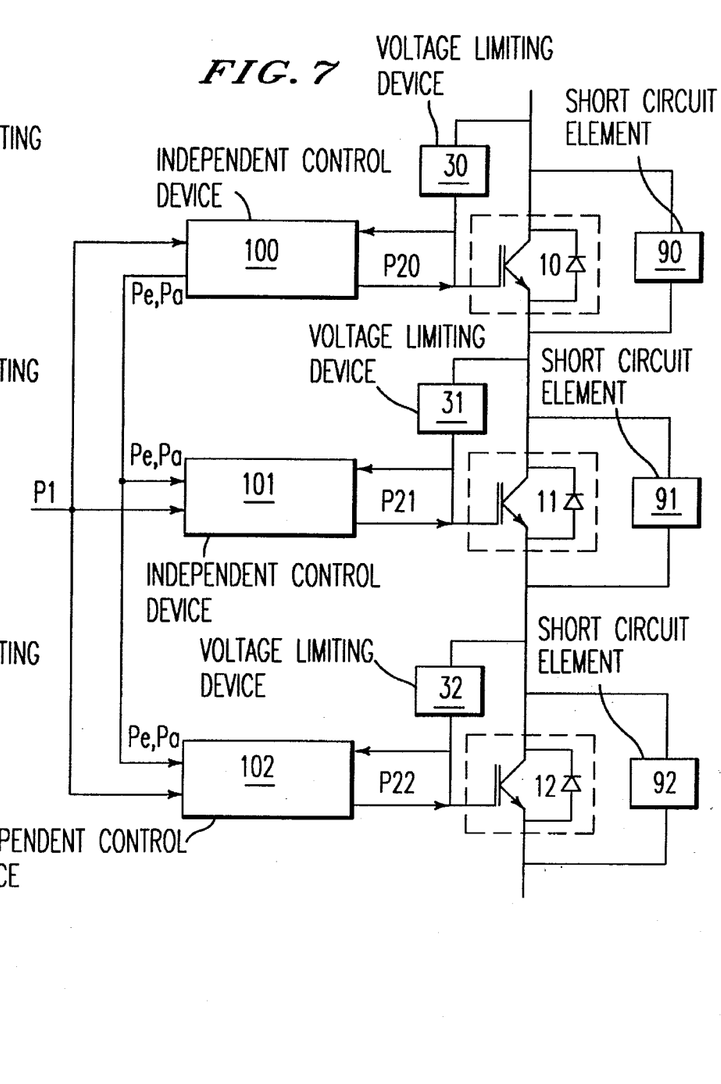

A fifth exemplary embodiment of the circuit arrangement, shown in FIG. 7, corresponds to the preceding exemplary embodiment, in that provision is made of a short-circuit element 90, 91 and 92, respectively, connected in each case in parallel with each of the semiconductor switches 10, 11 and 12. In this circuit arrangement, if a failure of one or more of the serially connected semiconductor switches 10, 11 and 12 occurs, so that the electrical conduction path for the switching current $I_s$ is interrupted, the respective short-circuit element 90, 91 or 92, respectively, accepts the current flow for a limited time and prevents the production of a disturbing electrical discharge (arc). The short-circuit element itself has a voltage response threshold which is larger than the response threshold of the corresponding voltage limiting device. The respective short-circuit element 90, 91 or 92, respectively, only intervenes if the voltage limitation by the voltage limiting device 30, 31 or 32, respectively, and the power control by the control device 100, 101 or 102, respectively, does not function, because the non-latching semiconductor switch 10, 11 or 12, respectively, has failed and, in so doing, has interrupted the current flow. If the voltage limiting device is connected between anode and cathode of a latching semiconductor switch—as shown in FIG. 5—the voltage limiting device accepts the current and a short-circuit element is not absolutely necessary.

Figure 8:
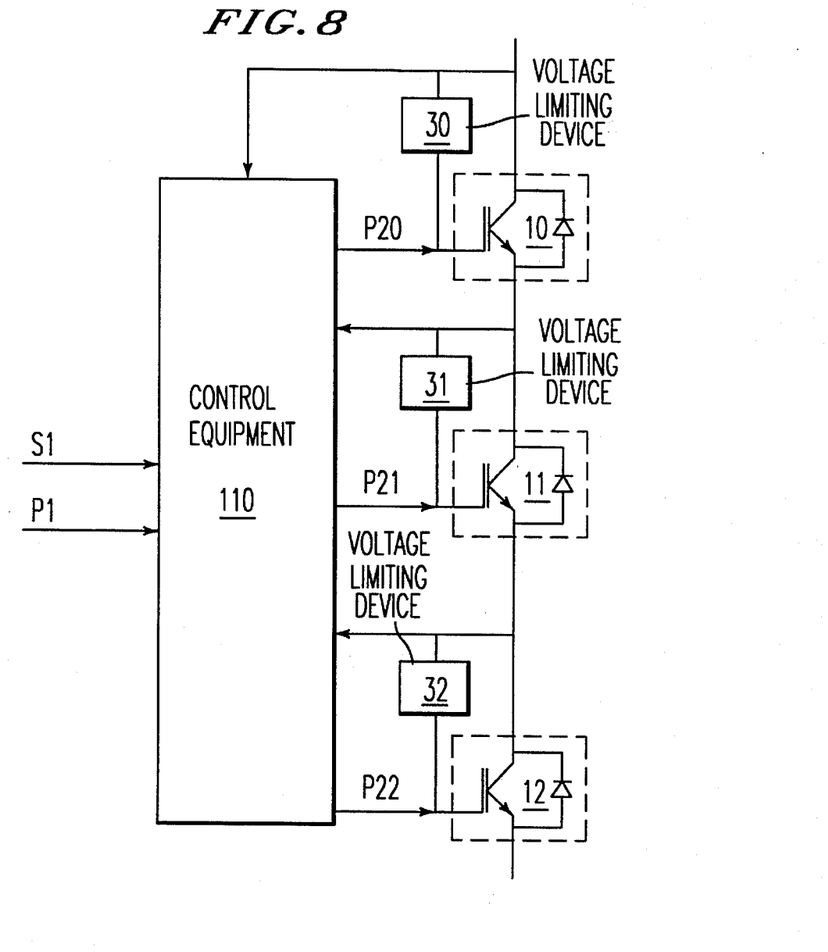

In a sixth exemplary embodiment of the circuit arrangement, shown in FIG. 8, modified control pulses $P_{20}$, $P_{21}$ and $P_{22}$ are generated by means of the control equipment 110 common to all the semiconductor switches 10, 11 and 12. By means of these control pulses, the voltage of each semiconductor switch is aligned with a voltage desired value $S_1$, which is smaller than the response voltage of the respective voltage limiting device. Since the voltage controller 110 controls the semiconductor voltage to a desired value $S_1$, which is smaller than the response voltage of the voltage limiting devices, the voltage limiting devices do not respond in continuous operation. The voltage limiting devices 30, 31, 32 only intervene so long as the voltage control has not yet corrected the asymmetries by means of edge displacement of the pulse $P_1$. The controlling-out process lasts only a few switching periods. This process therefore offers indirect protection of the voltage limiting devices. The precondition for this is that the voltage desired value $S_1$ is sufficiently smaller than the response voltage of the voltage limiting devices.

Figure 9:
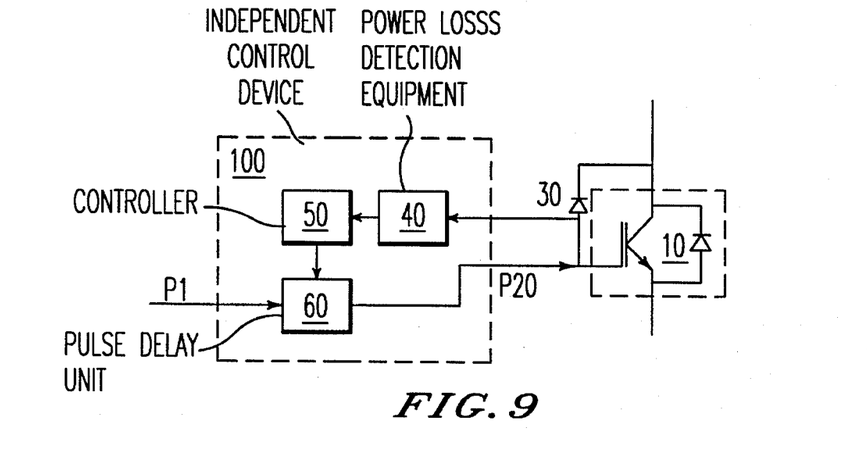

A seventh exemplary embodiment, shown in FIG. 9, shows a possible construction of the control device 100, which can also be applied in an analogous manner in the remaining semiconductor switches. This circuit arrangement has a voltage limiting device 30, designed as a zener diode, which is connected between the collector and the control electrode of the semiconductor switch 10. Connected to the zener diode 10 is a power loss detection equipment 40, with which the flow of a current in the zener diode is detected and is reported to a controller 50 having a pulse delay unit 60. On the basis of the actual value measured on the zener diode 10, the controller 50 forms a delay, in accordance with which the pulse delay unit delays the external control pulse $P_1$ and thereby forms a modified control pulse $P_{20}$.

Figure 10:
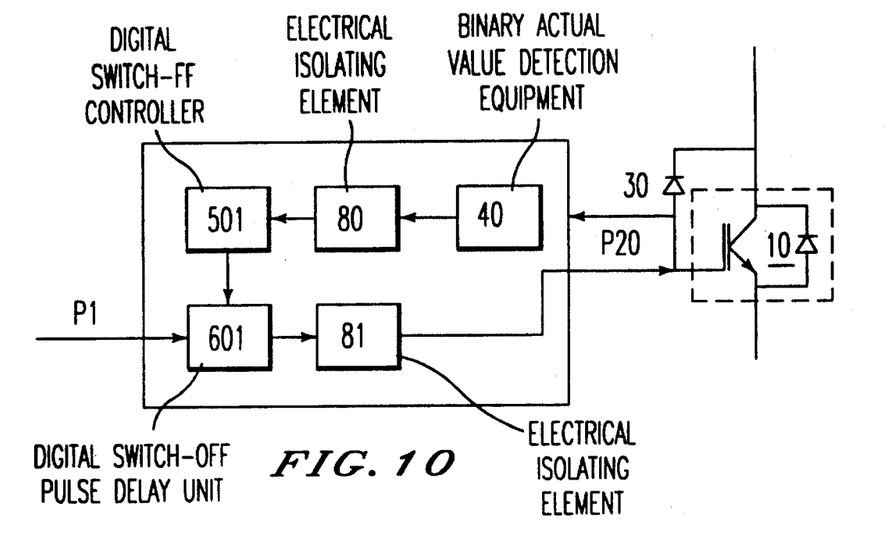

FIG. 10 shows a special embodiment of the circuit arrangement in FIG. 9, in which the detection equipment 40 is a binary actual value detection equipment. The binary actual value detection equipment 40 generates one pulse in each case per switch-off process (I-pulse), if a current flows through the voltage limiting device 30 when switching off. The I-pulse is transmitted via an electrical isolating element 80 (optocoupler) to a digital switch-off controller 501 which, after each I-pulse, increases the delay for the switch-off control pulse edge by one time quantum in each case. By this means, a modified control pulse $P_{20}$ is formed, which reaches the control input of the semiconductor switch 10 via an electrical isolating element 81.

Figure 11:
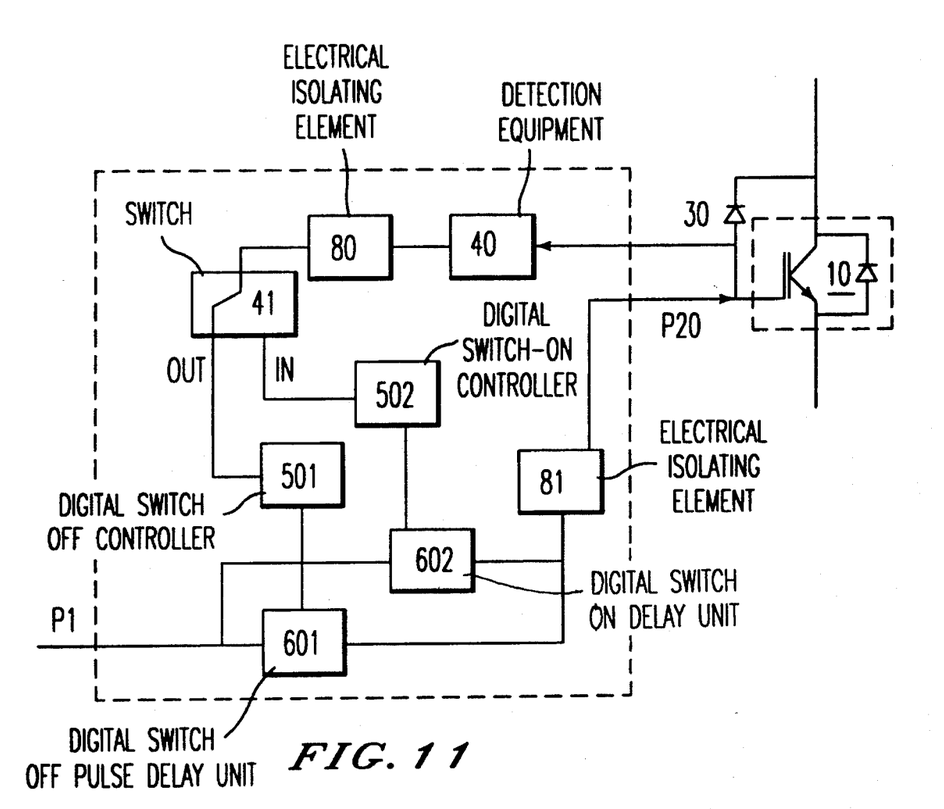

FIG. 11 shows a further special embodiment of the circuit arrangement in FIG. 9, in which the detection equipment 40 is also a binary actual value detection equipment, which generates one pulse per switching process (I-pulse), in the event that a current flows through the voltage limiting device on switching off. Here, the I-pulse is transmitted via an electrical isolating element 80 to a switch 41 which is controlled by the control pulse $P_1$ in such a way that the I-pulses from the switch-on reach a digital switch-on controller 502 and the I-pulses from the switch-off reach a digital switch-off controller 501. The outputs of the switch-on controller 502 and the switch-off controller 501, respectively, act respectively on a digital switch-on delay unit 602 and a digital switch-off pulse delay unit 601, so that a delayed control pulse $P_{20}$ is thereby formed. The delayed control pulse $P_{20}$ finally reaches the control input of the semiconductor switch 10 via an electrical isolating element 81.

In addition, provision can be made in this circuit arrangement of a binary voltage measuring element which reports the undershooting of a prescribed semiconductor switch voltage desired value after each switch-off to the digital switch-off controller 501, using a pulse (U-pulse), and thereby guarantees a reduction of the delay of the switch-off edge of the control pulse $P_1$ to be modified. By this means it is achieved that the voltage of the semiconductor switch does not undershoot this value. The voltage controller and the power loss controller of the voltage limiting device work in parallel. In the event that the semiconductor voltage is too low in the switched-off state, the switch-off pulse edge is made earlier by the voltage controller, so that the semiconductor switch voltage rises at the next switching off. In the event that the semiconductor switch voltage becomes too high, an I-pulse follows, which displaces the switch-off edge further and thereby reduces the switch-off voltage. The voltage controller and the controller of the power loss of the voltage limiting device consequently operate like a hysteresis controller of the voltage.

Figure 12:
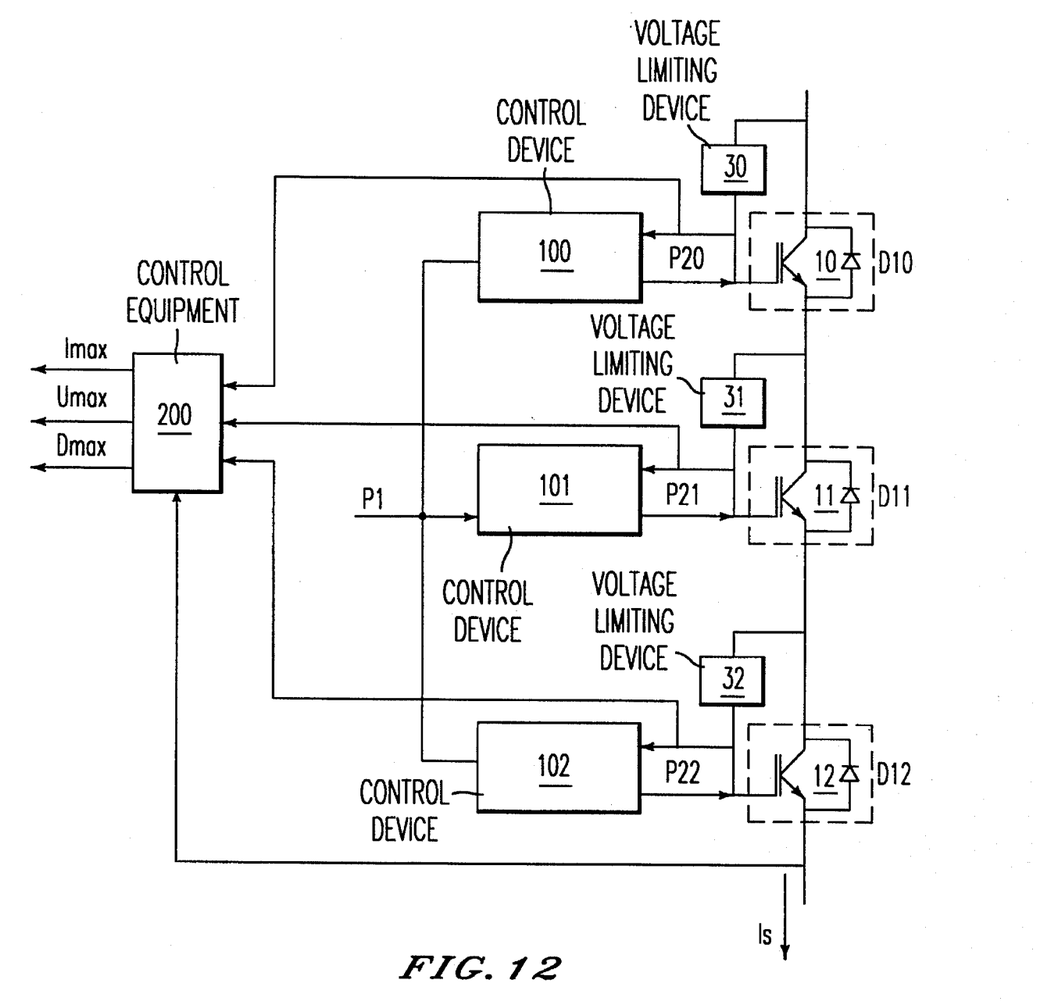

A tenth exemplary embodiment is shown in FIG. 12, in which, in addition to the circuit arrangement shown in FIG. 4, provision is made of a control equipment 200. The control equipment 200 detects the conditions of an overcurrent, an overvoltage and a diode asymmetry in the operating conditions described hereinafter.

The larger is the current of the series connected semiconductor switches 10, 11 and 12, the higher are voltage peaks produced during switching off this current. If the voltage peaks become so high that the response voltages of the voltage limiting devices 30, 31 and 32 are exceeded, these peaks cause a response of all the voltage limiting devices during the current switch-off time. The current, at which all the voltage limiting devices respond, is the maximum permissible switch current $I_{smax}$. The control equipment 200 detects this condition and generates an overcurrent signal $I_{max}$.

Under specific operating conditions, the applied DC voltage $U_{dc}$ can permanently exceed the maximum permitted value $U_{dcmax}$. This maximum voltage is distributed symmetrically across the individual semiconductor switches 10, 11 and 12, the response thresholds of all the voltage limiting devices 30, 31 and 32 being exceeded. This condition is steady, that is to say it lasts as long as the maximum voltage $U_{dcmax}$ is present. This condition, in which no switch current $I_s$ flows, can only be terminated by switching off the excessive voltage $U_{dc}$. The voltage limiting devices 30, 31 and 32 and the semiconductor switches 10, 11 and 12 can be destroyed in the long term by means of such a condition.

If the semiconductor switches 10, 11 and 12, shown in FIG. 12, of the upper switch 301 of the switch bridge, shown schematically in FIG. 1, are switched on, the said semiconductor switches accept the current $I_s$ from the antiparallel lower diodes of the semiconductor switches of the lower switch 302. The lower diodes switch off in an uncontrolled manner. Also, the switch-off behavior of these diodes deviates one from another. By means of snubbers, which are connected in parallel with the semiconductor switches in a similar way to the short-circuit elements 90, 91 and 92 shown in FIG. 7, the switching of the serially connected diodes can be balanced and a uniform voltage distribution can thus be ensured. If, in spite of this, overvoltage occurs on a diode, the corresponding voltage limiting device intervenes and the semiconductor switch connected in parallel with the relevant diode is switched on, so that the said semiconductor switch becomes conducting and limits the diode voltage. However, this process cannot be repeated arbitrarily often, because the corresponding voltage limiting device is loaded in each switch-off process. Here, the control equipment 200 is used for the purpose of generating a diode asymmetry signal $D_{max}$ in this event.

The overcurrent signal $I_{max}$, overvoltage signal $U_{max}$ and diode asymmetry signal $D_{max}$ supplied by the control equipment 200 can be used, for example, for additional control in such a circuit arrangement according to FIG. 12, in which the control devices are designed in accordance with FIG. 11 and an actual value filter is connected between the switch 41 and the controllers 501, 502. The actual value filter is driven by the overcurrent signal $I_{max}$ or by the overvoltage signal $U_{max}$ respectively, or by the diode asymmetry signal $D_{max}$ in such a way that, in the above described conditions, which lead to a generation of these signals, the actual values of the current flowing through the corresponding voltage limiting device and measured by the detection device 40 are filtered out by means of the actual value filter.

Figure 13:
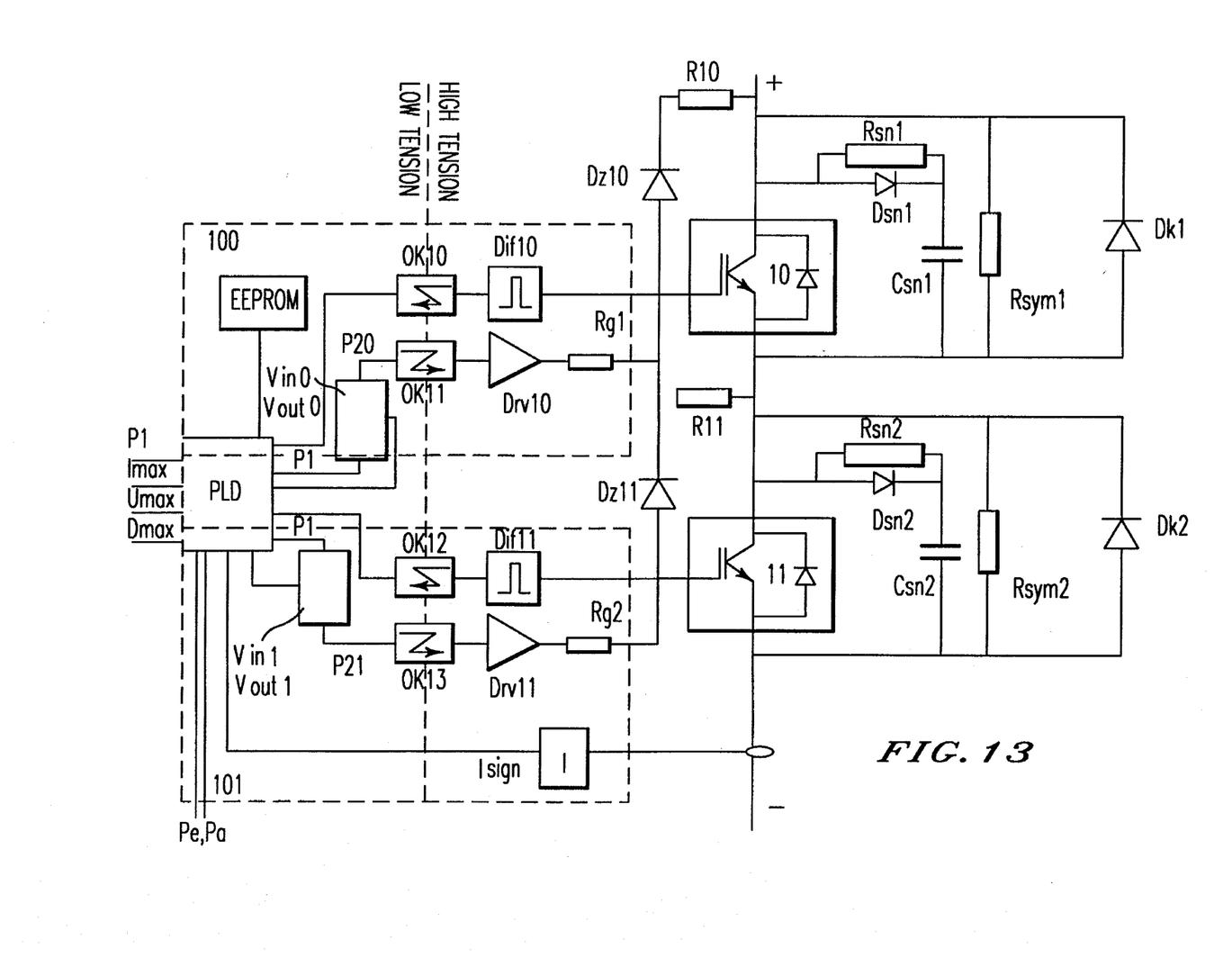

A concrete exemplary embodiment of the circuit arrangement, in which the series circuit has only two semiconductor switches with one control device per semiconductor switch in each case, is shown in FIG. 13. Here, one module of the semiconductor switches 10, 11 comprises in each case one IGBT and one free-running diode. RCD-snubbers protect the modules from overvoltage peaks during the switching off of the load current. The snubbers are formed by the elements $Rsn_1$, $Csn_1$, $Dsn_1$ and $Rsn_2$, $Csn_2$, $Dsn_2$, respectively. The balancing resistors $Rsym_1$, $Rsym_2$ ensure the steady voltage distribution of the series circuit. The short-circuit elements are designed as avalanche diodes $Dk_1$, $Dk_2$ or as varistors. The latter accept the current flow if the modules fail and the module voltage exceeds the response threshold of the voltage limiting devices and the higher response threshold of these short-circuit elements $Dk_1$, $Dk_2$.

In FIG. 13, the control device 100 of a master 10 and the control device 101 of a slave 11 are shown. The voltage limiting devices of the master and of the slave are designed as zener diodes $Dz_{10}$, $Dz_{11}$. The current flow through each zener diode $Dz_{10}$, $Dz_{11}$ is detected and generates in each case one pulse (I-pulse). The differential element $Dif_{10}$ or $Dif_{11}$, respectively, is responsible for this. The I-pulse is transmitted via the optocoupler $Ok_{10}$ or $Ok_{12}$, respectively, to the control device of the master or of the slave, respectively. The digital components of the control devices 100, 101 are integrated in a PLD (programmable logic device). The signals $P_a$ and $P_e$, as in the exemplary embodiment according to FIG. 7, are generated by the control device 100 of the master 10 and are fed further internally in the PLD to the slave controller 101. In addition, these signals $P_a$, $P_e$ are led out of the PLD and can be used for the control of further slave PLDs. In this way, as many slave PLDs as desired can be cascaded. The signal $P_e$ defines whether the switch-on edges are altered, the signal $P_a$ specifies whether the switch-off edges are changed. The signal $P_a$ or $P_e$, respectively, comprises two bits; one bit indicates that the corresponding edges are made earlier and the second bit indicates that the edges are made later. The calculated delay times are stored in the EEPROM (erasable electrical programmable read only memory) and are maintained after a voltage failure. The digitized delay times are loaded into the delay components for the switching on and switching off of the master $V_{in0}$, $V_{out0}$ and into the delay components for the switching on and switching off of the slave $V_{in1}$, $V_{out1}$, which makes possible delays in the nanosecond range. The loading of the newly calculated times is carried out by the PLD after each pulse. The central control signal $P_1$ is delayed by the delay elements $V_{in1}$, $V_{out1}$, $V_{in0}$, $V_{out0}$ and the modified control signals $P_{20}$, $P_{21}$ are transmitted to the drivers $Drv_{10}$, $Drv_{11}$ via the optocouplers $Ok_{11}$, $Ok_{13}$. The amplified signals reach the gates of the IGBTs via the gate resistors $Rg_1$, $Rg_2$.

The PLD also generates the binary signals $I_{max}$, in the event that the I-pulses of all the voltage limiting devices respond, while the load current is being switched off by the IGBTs. In the event that all the I-pulses are generated in the non-current condition, the signal $U_{max}$ is generated. The signal $D_{max}$ (diode asymmetry) is generated in the event that all the I-pulses are present and the load current $I_s$ is switched off by the free-running diodes, that is to say if the load current in FIG. 13 is directed toward plus. The load current is detected by the current sensor I, which specifies the current direction by means of the binary signal $I_{sign}$. The error conditions which correspond to the signals $U_{max}$, $I_{max}$, $D_{max}$ are stored in a fault register of the PLD. The external activation of the reset signal effects the resetting of the error conditions and of the signals $U_{max}$, $I_{max}$ and $D_{max}$.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for driving semiconductor switches connected in a series circuit by equalizing the voltage distribution across the semiconductor switches comprising the steps of:

providing a voltage limiting device for each of said semiconductor switches, each voltage limiting device being connected between the collector and control electrode of the respective semiconductor switch;

detecting the amount of power loss from each of said voltage limiting devices and controlling said power loss to be at a minimum;

generating modified control pulses for controlling each semiconductor switch by means of control equipment, based on the receipt of a common control pulse and the detected power loss;

wherein said semiconductor switches are non-latching semiconductor switches.

2. The method as claimed in claim 1, wherein the control equipment is formed in each case by one control device per semiconductor switch.

3. The method as claimed in claim 1, wherein the power loss of the voltage limiting devices is controlled to zero.

4. The method as claimed in claim 1, wherein the modified control pulses are formed by time displacement of the switching edges of the control pulse.

5. The method as claimed in one of claims 1, wherein a short-circuit element is in each case connected in parallel with one semiconductor switch so that, in the event of exceeding a response threshold of the short-circuit element, which threshold is higher than the response threshold of the respective voltage limiting device, the short-circuit element accepts the current flow from the respective semiconductor switch.

6. The method as claimed in claim 2, wherein the power loss of the voltage limiting devices is controlled to zero.

\* \* \* \* \*